(12) United States Patent
Oda et al.

(10) Patent No.: US 6,274,476 B1
(45) Date of Patent: Aug. 14, 2001

(54) SEMICONDUCTOR DEVICE AND METHOD OF MANUFACTURING THE SAME

(75) Inventors: Noriaki Oda; Kiyotaka Imai, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/275,532

(22) Filed: Mar. 24, 1999

(30) Foreign Application Priority Data

Apr. 3, 1998 (JP) .................................................. 10-091538

(51) Int. Cl.$^7$ ........................ H01L 21/4763; H01L 21/31
(52) U.S. Cl. ........................ 438/624; 438/626; 438/759; 438/783
(58) Field of Search ........................ 438/622–626, 438/631–633, 697–699, 703, 778, 783–784, 787, 958, 759

(56) References Cited

U.S. PATENT DOCUMENTS 5,106,770 * 4/1992 Bulat et al. ........................ 438/618
5,888,905 * 3/1999 Taylor et al. ........................ 438/705

FOREIGN PATENT DOCUMENTS

| H02-077127 | 3/1990 | (JP) . |
| 7-307293 | 11/1995 | (JP) . |
| 9-45769 | 2/1997 | (JP) . |
| 9-139428 | 5/1997 | (JP) . |
| H9-266207 | 10/1997 | (JP) . |
| H10-022389 | 1/1998 | (JP) . |
| H10-056009 | 2/1998 | (JP) . |

* cited by examiner

*Primary Examiner*—John F. Niebling
*Assistant Examiner*—Ha Tran Nguyen
(74) *Attorney, Agent, or Firm*—Scully, Scott, Murphy & Presser

(57) ABSTRACT

In a semiconductor device having a multilayer metallization structure using SiOF film as an interlayer insulating film, with respect to the interlayer insulating film, the fluorine concentration of SiOF films (11, 16) in a wiring gap portion in the same layer wiring is set to be higher than the fluorine concentration of SiOF films (12, 17) between the upper and lower layer wirings (8, 15; 15, 20).

10 Claims, 7 Drawing Sheets

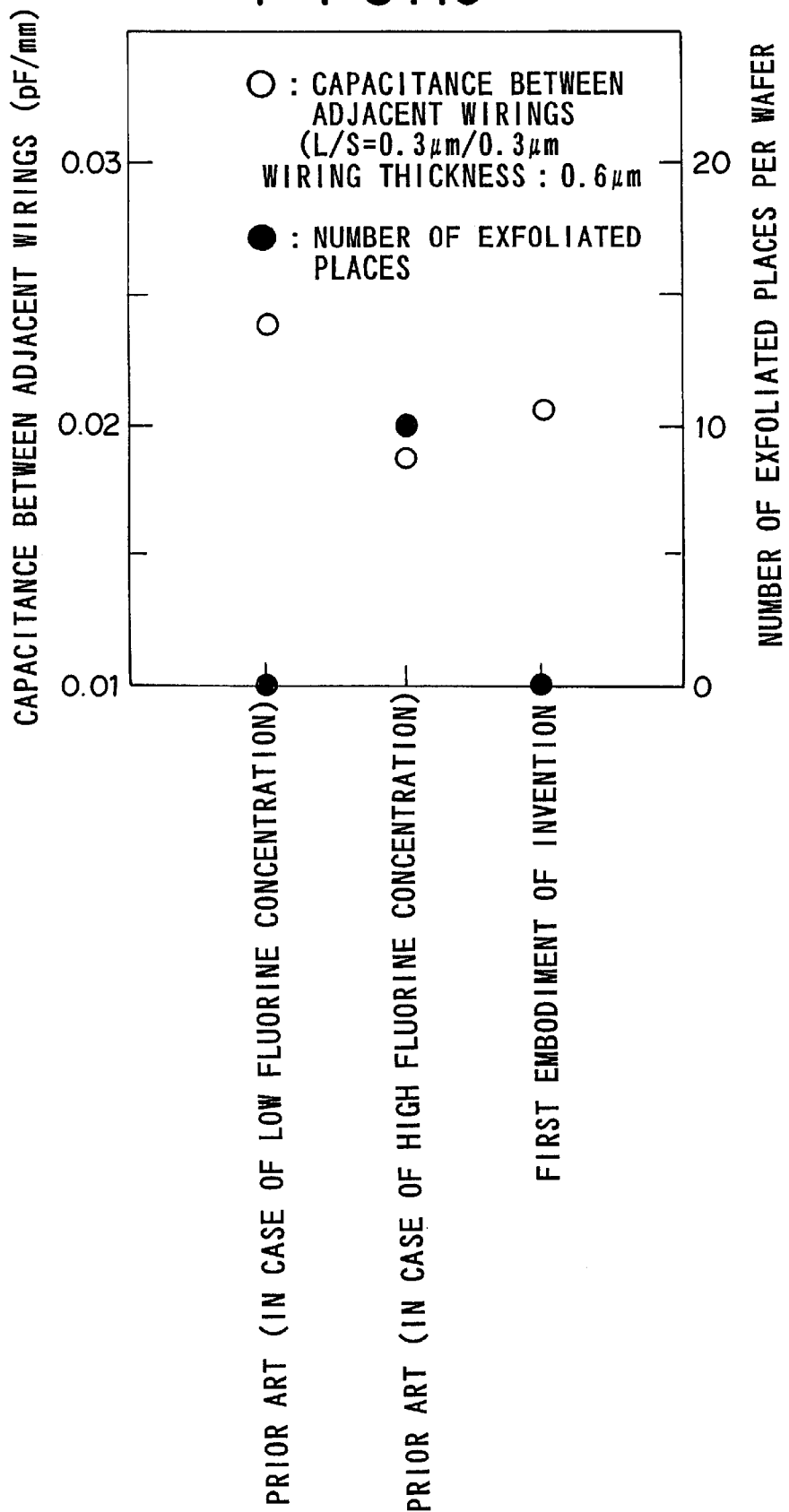

F I G. 13
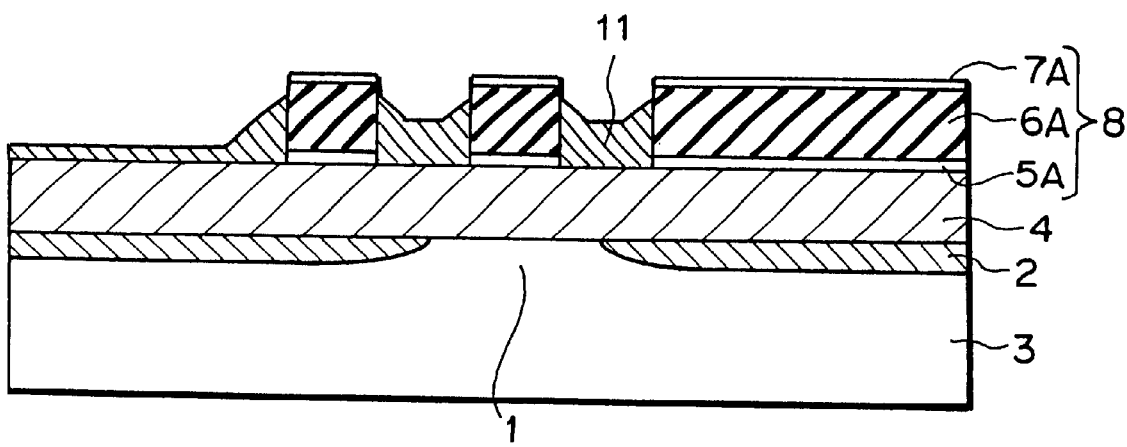
F I G. 14
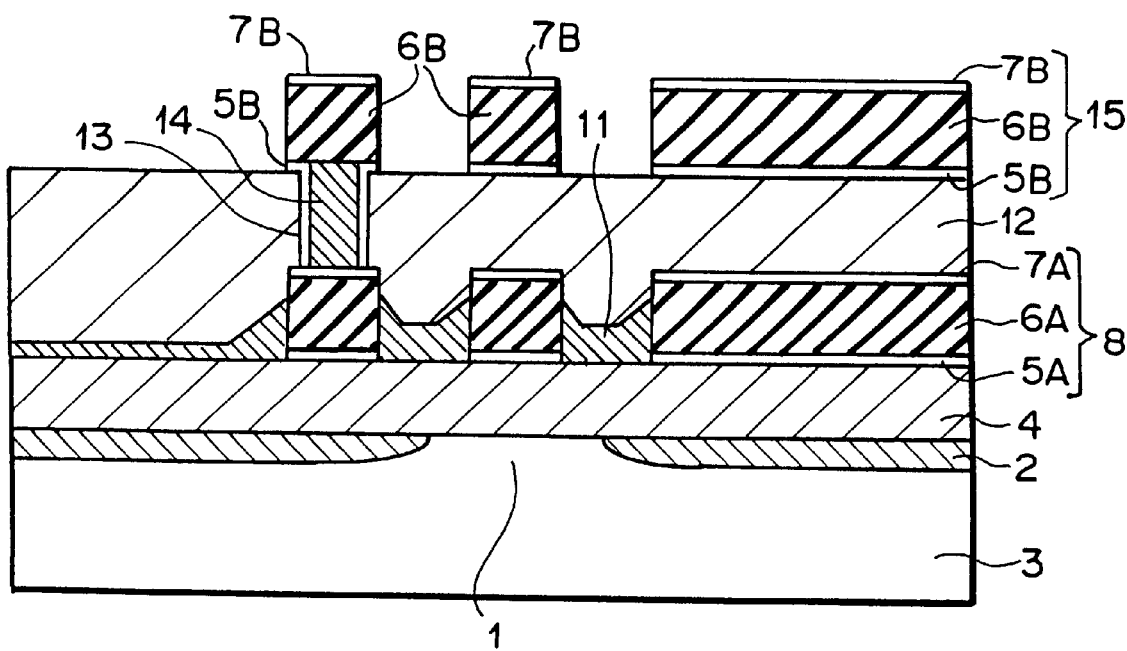

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device which contains a plurality of wirings juxtaposed with one another and uses SiOF as an insulating film, a semiconductor device having multilayer metallization and uses SiOF as an interlayer insulating film, and a method of manufacturing these semiconductor devices.

2. Description of the Related Art

Following the enhancement in integration degree and micro-structure design of semiconductor devices, there have been tendencies to reduce the wiring pitch and increase the parasitic capacitance (called as "wiring capacitance") attendant to wirings. Materials having lower specific dielectric constant have been used as interlayer insulating films to reduce the wiring capacitance. Of these materials, SiOF is an insulating material having the lowest specific dielectric constant in inorganic materials formable by a plasma CVD method which has been hitherto used.

A semiconductor device using SiOF as an interlayer insulating film will be described with reference to FIG. 1 and FIGS. 2 to 4.

FIG. 1 is a cross-sectional view showing a conventional semiconductor device, and FIGS. 2 to 4 are cross-sectional views showing a method of manufacturing the semiconductor device shown in FIG. 1. In this case, a three-layer metallization structure is shown. As shown in FIG. 1, an interlayer insulating film 12 formed of SiOF is provided in a wire gap portion of a first layer wiring 8 and at the upper side of the first layer wiring 8, and also an interlayer insulating film 17 formed of SiOF is provided in a wire gap portion of a second layer wiring 15 and at the upper side of the second layer wiring 15. The thickness of the interlayer insulating film 17 is set to 0.6 micrometer to 1.0 micrometer at the upper side of the second layer wiring 15.

A method of manufacturing such a conventional semiconductor device will be described with reference to FIGS. 2 to 4.

First, as shown in FIG. 2, a diffusion layer 1 and the element isolation region 2 are formed on the semiconductor substrate 3, and the first interlayer insulating film 4 is grown on the diffusion layer 1 and the element isolation region 2. Then a barrier metal layer 5A, an aluminum layer 6A and a titanium nitride layer 7A are successively formed. Thereafter, a desired pattern is left to form the first layer wiring 8, and SiOF film 11 is formed thereon.

Subsequently, as shown in FIG. 3, SiOF film 11 is flattened to form a flattened SiOF film 9. Then, as shown in FIG. 4, a viahole 13 is selectively formed in the SiOF film 9 on the first layer wiring 8 to form a second interlayer insulating film 12, a tungsten plug 14 is formed in the viahole 13, and a barrier metal layer 5B, an aluminum layer 6B and a titanium nitride layer 7B are successively formed. Thereafter, a desired pattern is left to form the second layer wiring 15.

Subsequently, as shown in FIG. 1, a third interlayer insulating film 17 having a viahole 18 is formed, a tungsten plug 19 is informed in the viahole 18, and a barrier metal layer 5C, an aluminum layer 6C and a titanium nitride layer 7C are successively formed. Thereafter, a desired pattern is left to form the third layer wiring 20. Then, a cover film 21 is formed, thereby completing the final structure shown in FIG. 1.

In the semiconductor device thus constructed, when the fluorine concentration in SiOF constituting the interlayer insulating film is set to be less than 5 atom %, any effect of reducing the dielectric constant cannot be obtained. Therefore, the wiring capacitance is increased, resulting in reduction of a circuit operating speed and increase of power consumption. On the other hand, if the fluorine concentration in SiOF constituting the interlayer insulating film is set to 5 atom % or more, exfoliation of the interlayer insulating film or the wirings is more liable to occur, and the yield is reduced. That is, for the conventional semiconductor device, it has been difficult to set the optimum fluorine concentration.

SUMMARY OF THE INVENTION

The present invention has been implemented in view of the foregoing problem of the conventional semiconductor device, and according to a first aspect of the present invention, a semiconductor device having a plurality of wirings juxtaposed with one another and using SiOF insulating film, is characterized in that with respect to the insulating film, the fluorine concentration of SiOF insulating film in a wire gap portion is set to be higher than the fluorine concentration of SiOF insulating film on the wires.

Further, according to a second aspect of the present invention, a semiconductor device having a multilayer metallization wiring structure, i.e. having a plurality of wiring layers, using SiOF interlayer insulating film, is characterized in that, with respect to the interlayer insulating film, the fluorine concentration of SiOF interlayer insulating film in a wire gap portion is set to be higher than the fluorine concentration of SiOF interlayer insulating film on the wirings.

According to a third aspect of the present invention, a semiconductor device manufacturing method is characterized by comprising a step of forming a plurality of wirings on the same plane, a step of forming a first insulating film of SiOF on the plane having the plural wirings formed thereon and removing the first insulating film on the upper surfaces of the plural wirings, a step of introducing fluorine into at least the first insulating layer, and a step of forming a second insulating layer of SiOF thereon.

According to a fourth aspect of the present invention, a semiconductor device manufacturing method is characterized by comprising a step of forming a plurality of wirings on the same plane, a step of forming a first insulating film of SiOF on the plane having the plural wirings formed thereon and introducing fluorine into at least the first insulating film, a step of removing the first insulating film on the upper surfaces of the plural wirings, and a step of forming a second insulating layer of SiOF thereon.

According to the present invention, both of the reduction of the wiring capacitance and the prevention of the exfoliation of the interlayer insulating film and the wirings can be implemented.

BRIEF DESCRIPTION OF THE DRAWINGS

FIG. 10 is a diagram showing the experimental result for exhibiting the effect of the first embodiment of the present invention;

FIG. 13 is a cross-sectional view showing the manufacturing process of the second embodiment according to the present invention; and FIG. 14 is a cross-sectional view showing the manufacturing process of the second embodiment according to the present invention.

DETAILED DESCRIPTION OF THE PREFERRED EMBODIMENTS

Preferred embodiments according to the present invention will be described hereunder with reference to the accompanying drawings.

(First Embodiment)

Figure 5:
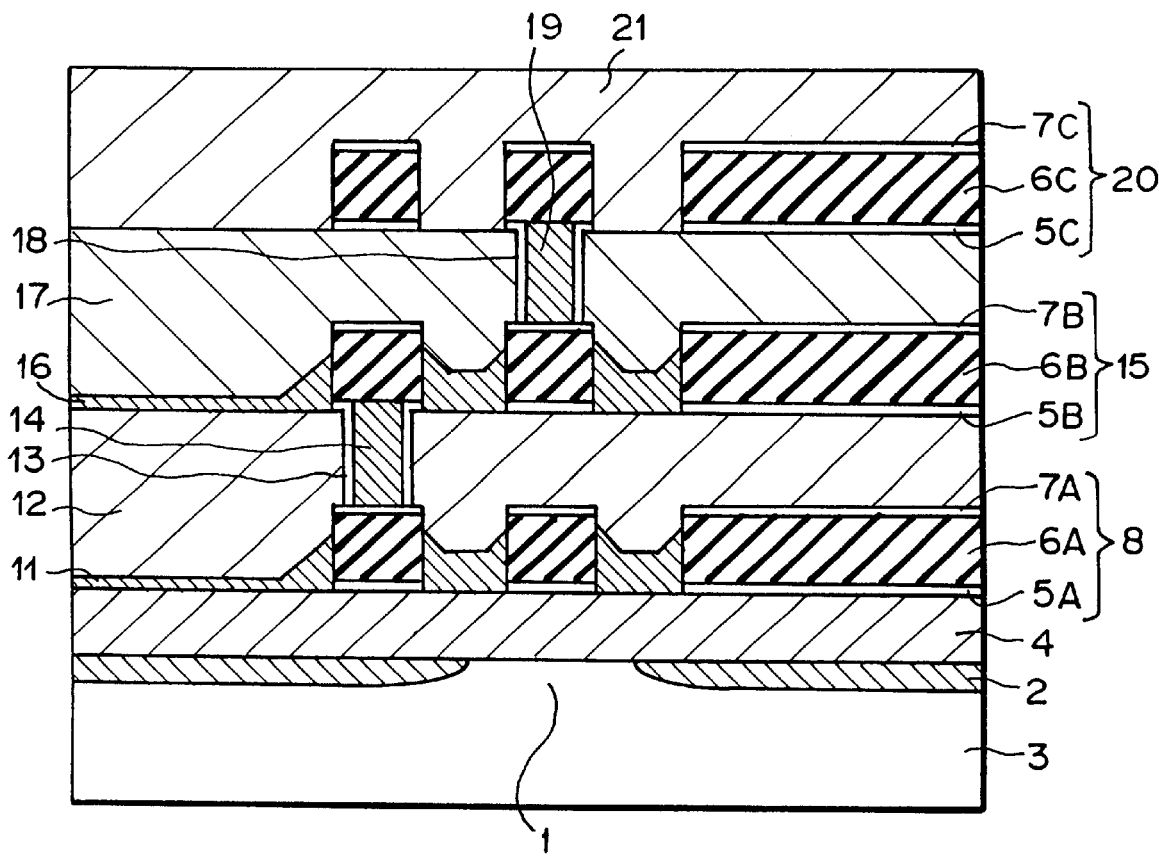
FIG. 5 is a cross-sectional view showing a semiconductor device according to a first embodiment of the present invention.

A first embodiment according to the present invention will be described with reference to FIG. 5. FIG. 5 is a cross-sectional view showing a semiconductor device according to a first embodiment of the present invention.

Figure 1:
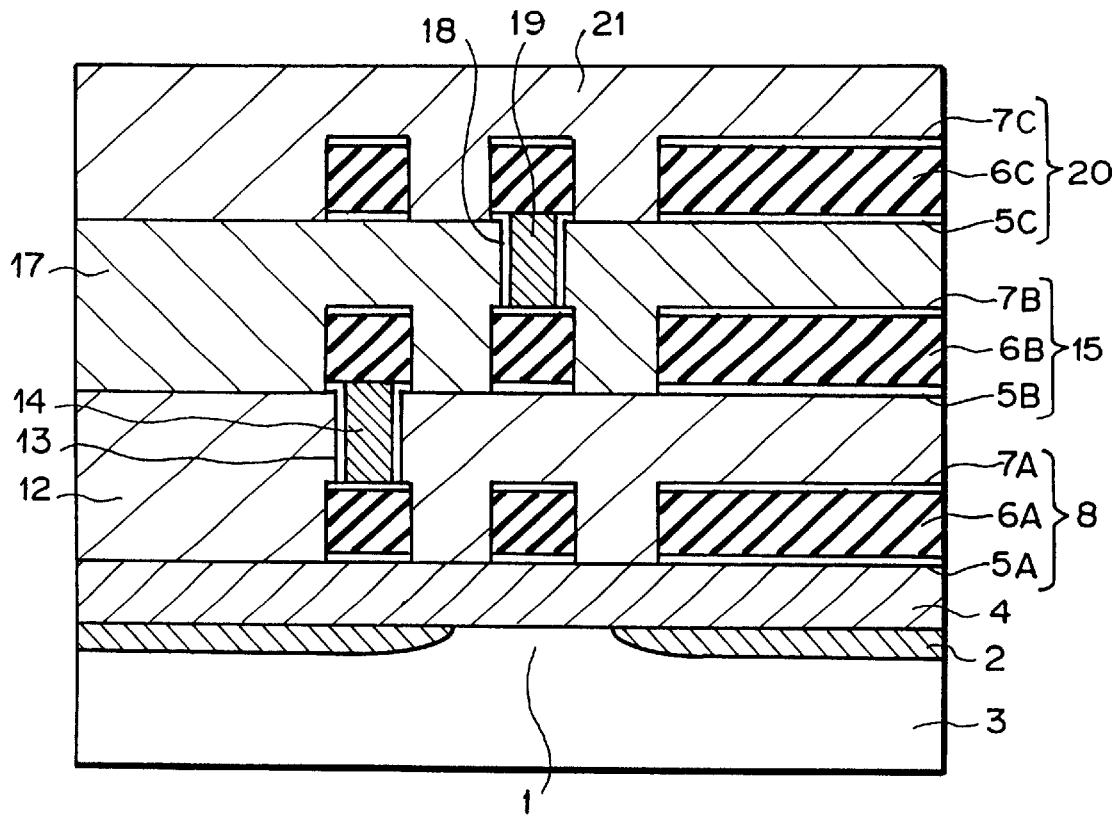
FIG. 1 is a cross-sectional view showing a conventional semiconductor device.
Figure 2:
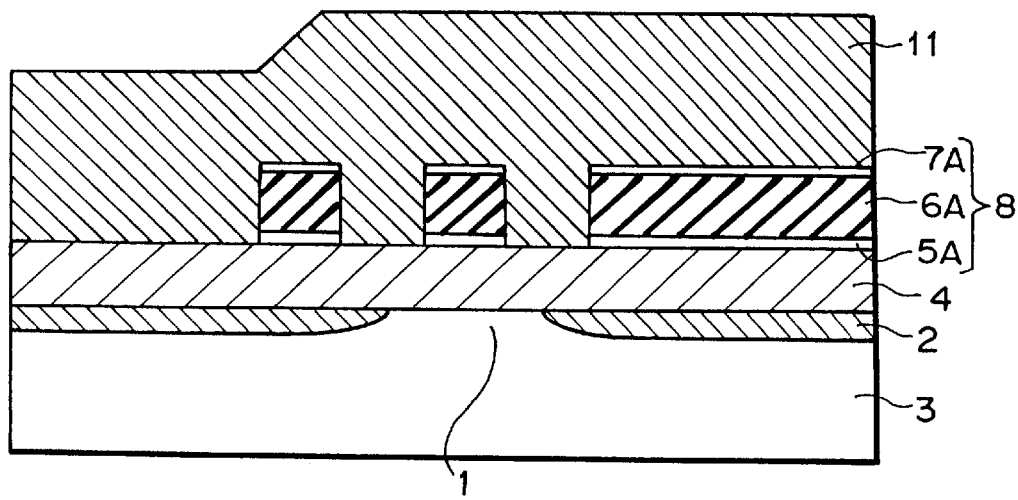
FIG. 2 is a cross-sectional view showing a conventional semiconductor device manufacturing process.
Figure 3:
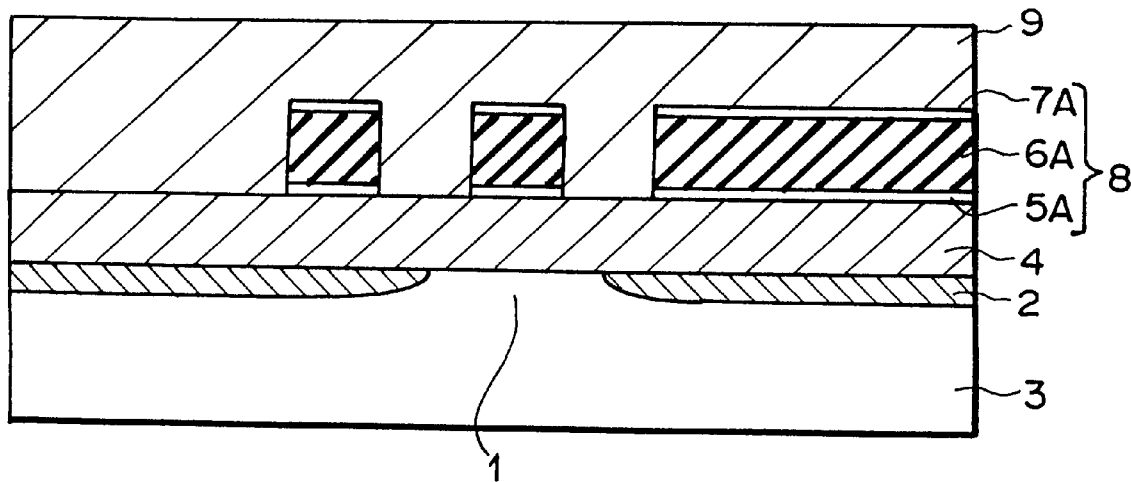
FIG. 3 is a cross-sectional view showing the conventional semiconductor device manufacturing process.
Figure 4:
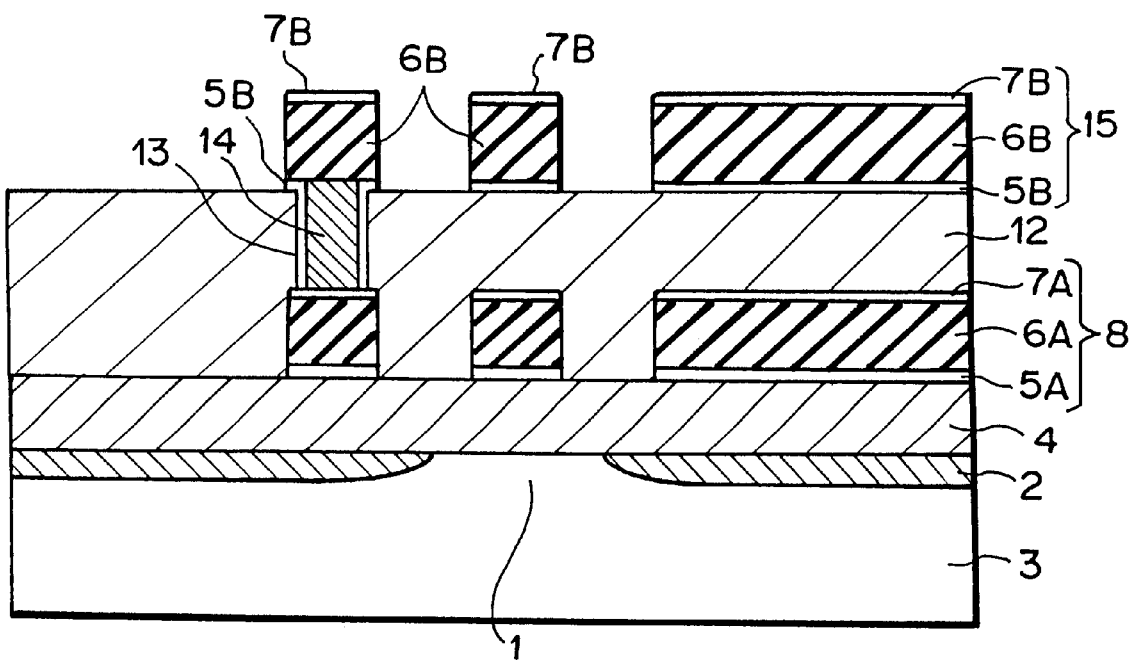
FIG. 4 is a cross-sectional view showing the conventional semiconductor device manufacturing process.

In FIG. 5, a first interlayer insulating film 4 which is formed of BPSG or the like and has a thickness of about 0.8 micrometer is disposed on a semiconductor substrate 3 having a diffusion layer region 1 and an element isolation region 2, and a first layer wiring 8 is disposed on the first interlayer insulating film 4. A contact opening portion through which the diffusion layer region 1 and the first layer wiring 8 are connected to each other is formed in the first interlayer insulating film 4, however, it is omitted from the illustration of FIG. 1. SiOF film 11 having a high fluorine concentration is provided in a wiring gap portion of the first layer wiring 8, and an interlayer insulating film 12 of SiOF having a low fluorine concentration is provided on the upper side of SiOF film 11 and the first layer wiring 8. The thickness of the interlayer insulating film 12 is set to 0.6 micrometer to 1.0 micrometer above the first layer wiring 8. A first viahole 13 is selectively formed in SiOF film 12 having the low fluorine concentration, and a second layer wiring 15 exists in a region containing the first viahole 13.

SiOF film 16 having a high fluorine concentration is provided in a wiring gap portion of the second layer wiring 15, and an interlayer insulating film 17 of SiOF having a low fluorine concentration exists at the upper side of SiOF film 16 and the second layer wiring 15. The thickness of the interlayer insulating film 17 is set to 0.6 micrometer to 1.0 micrometer at the upper side of the second layer wiring 15. A second viahole 18 is selectively formed in SiOF interlayer insulating film 17 having a low fluorine concentration, and a third layer wiring 20 exists in a region containing the second viahole 18. Further, a cover film 21 formed of SiON or the like and having a thickness of 0.3 micrometer is formed on the third layer wiring 20 so as to cover the overall surface.

Each of the first layer wiring 8, the second layer wiring 15 and the third layer wiring 20 comprises a barrier metal layer 5A, 5B, 5C which is formed of a titanium film of about 30 nm thickness and a titanium nitride film of about 100 nm thickness, an aluminum layer 6A, 6B, 6C of about 0.5 micrometer thickness and a titanium nitride film 7A, 7B, 7C of about 30 nm thickness in this order from the bottom side. The fluorine concentration of SiOF interlayer insulating films 12, 17 having the low fluorine concentration is set to be less than 5 atom %, and the fluorine concentration of SiOF films 11, 16 is set to 5 atom % or more. A plasma oxide film may be formed at a thickness of 0.1 micrometer to 0.3 micrometer between SiOF film 12 of low fluorine concentration and the second layer wiring 15 serving as the upper layer wiring for SiOF film 12 and between SiOF film 17 of low fluorine concentration and the third layer wiring 20 serving as the upper layer wiring for SiOF film 17 in order to prevent corrosion of wirings due to the direct contact between the wirings and fluorine, however, the plasma oxide film is omitted from the illustration of FIG. 5.

In this embodiment, the SiOF films 11, 16 and SiOF films 12, 17 are the first and second SiOF films respectively of the interlayer insulating film of the present invention.

In this embodiment, the three layer wiring structure is shown, however, a one layer wiring structure, a two layer wiring structure or a four or more layer wiring structure may be applied.

Next, a method of manufacturing a semiconductor device according to the present invention will be described with reference to FIGS. 6 to 9. FIGS. 6 to 9 are cross-sectional views showing the manufacturing process.

Figure 6:
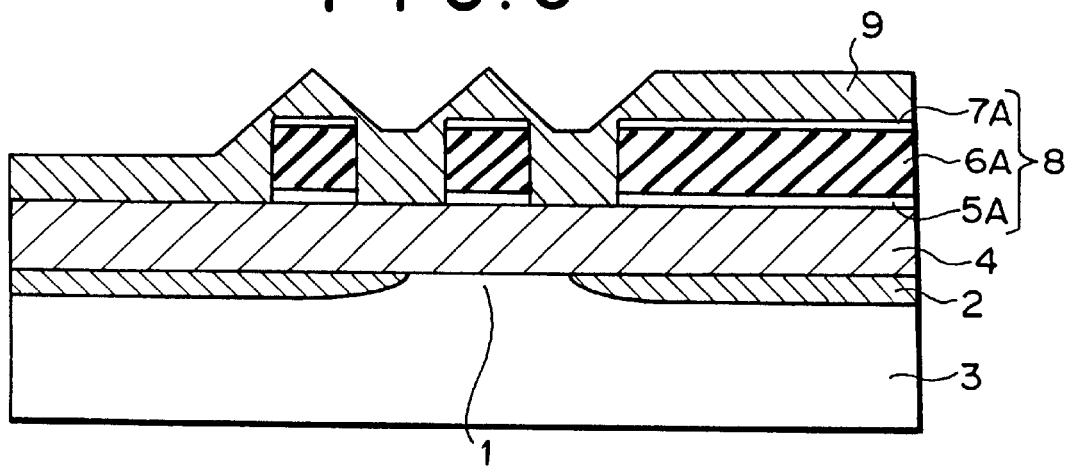
FIG. 6 is a cross-sectional view showing a manufacturing process of the first embodiment according to the present invention.

First, as shown in FIG. 6, the diffusion layer region 1 and the element isolation region 2 are formed on the semiconductor substrate 3, and the first interlayer insulating film 4 which is formed of BPSG or the like and has a thickness of about 1.2 micrometer is grown thereon. The first interlayer insulating film 4 thus formed is subjected to a chemical and mechanical polishing treatment (CMP) to be flattened so that the thickness of the first interlayer insulating film 4 on the diffusion layer is finally equal to 0.8 micrometer. Then, a contact opening (not shown) is selectively formed, and the barrier metal layer 5A, the aluminum layer 6A of about 0.5 micrometer thickness and the titanium nitride layer 7A of about 30 nm thickness are successively formed by the sputtering method. Thereafter, a desired pattern is left by a photolithography process and a reactive ion etching treatment to form the first layer wiring 8, and SiOF film 9 is formed, for example by a bias ECR method so as to have a thickness of about 0.6 micrometer on the first layer wiring 8 having relatively wider width. At this time, the gap portion of the first layer wiring 8 is perfectly filled with SiOF film 9, and the surface of SiOF film 9 becomes triangular on the first layer wiring 8 having relatively narrower width.

Figure 7:
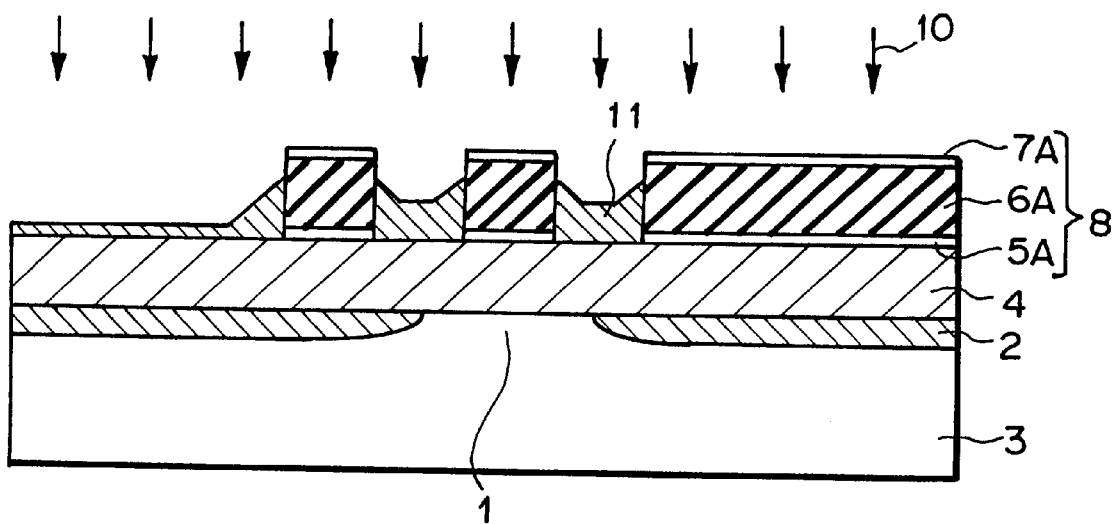
FIG. 7 is a cross-sectional view showing the manufacturing process of the first embodiment according to the present invention.

Subsequently, as shown in FIG. 7, SiOF film 9 is subjected to an anisotropic etching by reactive ion etching to remove SiOF on the upper surface of the first layer wiring 8. At this time, SiOF film 11 remains having about a half of the thickness of the first layer wiring 8 at the center in the gap portion of the first layer wiring. In this state, fluorine is ion-implanted, for example under the following condition: an acceleration energy of 10 keV to 100 keV and a dose amount of $5 \times 10^{14}$ cm$^{-2}$ to $3 \times 10^{15}$ cm$^{-2}$. SiOF is removed by the etching also in the gap portion of the first layer wiring 8, and thus the thickness of the SiOF film 11 at the center in the gap portion of the first layer wiring is equal to about a half of the thickness of the first layer wiring 8. In consideration of reduction in wiring capacitance, it is preferable that the thickness of the SiOF film 11 at the center of the wiring gap portion is within the range of 1/3 to 1/1 times of the thickness of the wiring 8, and it is more preferable that the wiring gap portion is filled with thicker SiOF film 11 or perfectly filled SiOF film 11.

Figure 8:
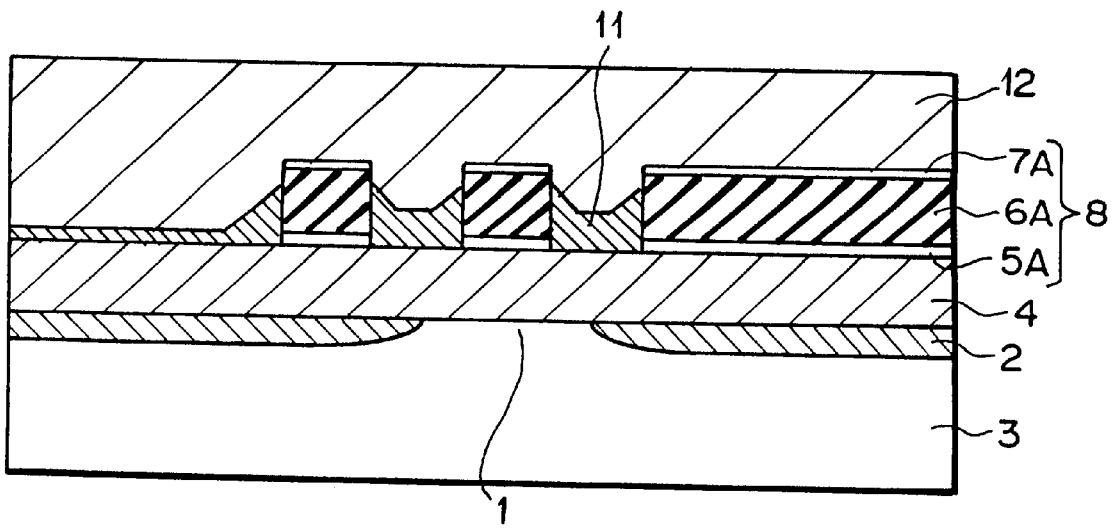
FIG. 8 is a cross-sectional view showing the manufacturing process of the first embodiment according to the present invention.

Subsequently, as shown in FIG. 8, SiOF film 12 having the low fluorine concentration is formed by a bias ECR plasma CVD method or the like, and the surface thereof is flattened by the chemical and mechanical polishing treatment. The thickness of SiOF film 12 is set to about 0.8 micrometer above the first layer wiring 8. The fluorine concentration of SiOF film 12 is preferably set to be equal to or lower than the fluorine concentration of SiOF film 11 before the ion implantation.

Figure 9:
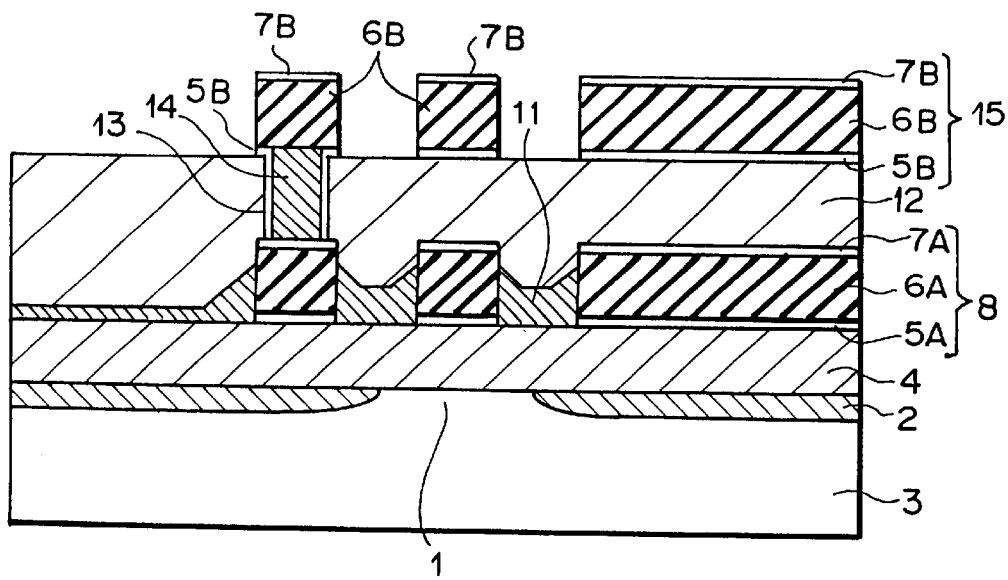
FIG. 9 is a cross-sectional view showing the manufacturing process of the first embodiment according to the present invention.

Subsequently, as shown in FIG. 9, a viahole 13 is selectively formed in the low fluorine concentration SiOF film 12 on the first layer wiring 8, and a barrier metal layer 5B comprising titanium of about 30 nm thickness and titanium nitride of about 0.1 micrometer thickness which are deposited in this order from the lower side is formed by the sputtering method or the like. Thereafter, tungsten film is formed on the overall surface by the CVD method and then subjected to an etch-back treatment to leave tungsten plug 14 only in the viahole 13. Subsequently, aluminum layer 6B of about 0.5 micrometer thickness and titanium nitride 7B of about 50 nm thickness are successively formed by the sputtering method or the like, and a desired pattern is formed by a photolithography process and a reactive ion etching process to form the second layer wiring 15.

Subsequently, the steps from FIG. 6 to FIG. 9 are repeated once again to form the third layer wiring 20, and a cover film 21 of SiON or the like is finally formed, thereby completing the final structure shown in FIG. 5.

The manufacturing method as described above is applied to the three layer metallization structure, however, it may be applied to a more multilayer metallization structure by increasing the number of repetition of the steps from the step of forming the interlayer insulating film to the step of forming the upper layer wiring.

In this first embodiment, since the fluorine concentration in SiOF film between the adjacent wirings in the same layer wiring is higher than the fluorine concentration in SiOF film between the upper and lower layer wirings, the capacitance between the adjacent wirings can be reduced. Further, the fluorine concentration in SiOF film between the upper and lower layer wirings is low, and thus the upper layer wirings and the interlayer insulating film can be prevented from being exfoliated while the subsequent steps are carried out.

FIG. 10 shows the effect of the first embodiment. Specifically, in FIG. 10, the wiring capacitance and the occurrence degree of exfoliation of the interlayer insulating film (the number of places at which the exfoliation of the interlayer insulating film occurs) in this embodiment are compared with those in the conventional case where the fluorine concentration is uniform in the interlayer insulating film. As compared with a case where the fluorine concentration is high in the conventional case, the increase of the wiring capacitance in this embodiment is limited to about 2%, but the occurrence degree of the exfoliation is reduced to zero. Further, as compared with a case where the fluorine concentration is low in the conventional case, the occurrence degree of the exfoliation is still equal to zero (i.e., there is no variation), and the wire capacitance can be reduced by about 7% in this embodiment. This is because the fluorine concentration in SiOF film between the adjacent wirings in the same layer wiring is high and thus the wiring capacitance can be reduced even when the fluorine concentration in SiOF film at the upper and lower sides of the wiring is low. Further, with respect to the exfoliation of the interlayer insulating film, the fluorine concentration in SiOF film at the upper and lower sides of the wiring is low, and thus moisture absorption of the SiOF film is little and thus the adhesion between SiOF film and the lowermost layer of the upper layer wiring of the titanium-based high melting point metal is kept, so that the occurrence degree of the exfoliation is small.

(Second Embodiment)

Next, the semiconductor device manufacturing method of a second embodiment of the present invention will be described with reference to FIGS. 11 to 14. FIGS. 11 to 14 are cross-sectional views showing the manufacturing process.

Figure 11:
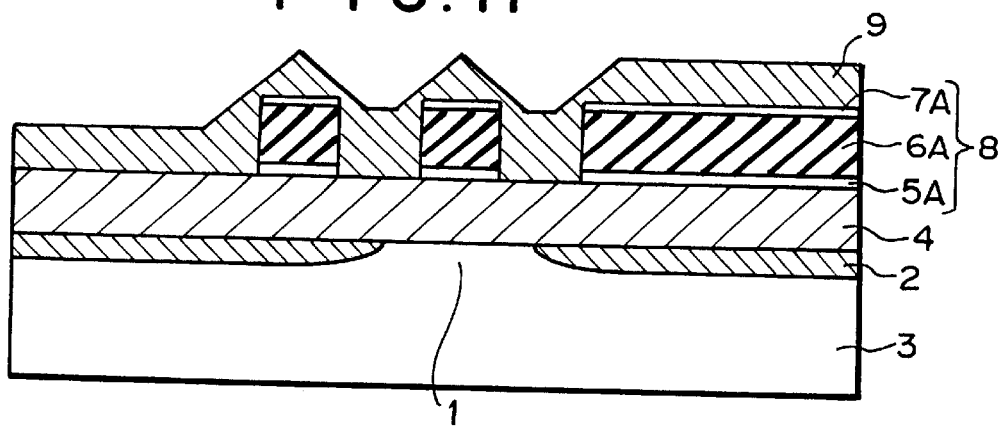
FIG. 11 is a cross-sectional view showing a manufacturing process of a second embodiment according to the present invention.

First, as shown in FIG. 11, the diffusion layer region 1 and the element isolation region 2 are formed on the semiconductor substrate 3, the first interlayer insulating film 4 which is formed of BPSG or the like and has a thickness of about 1.2 micrometer is grown on the diffusion layer region 1 and the element isolation region 2, and the first interlayer insulating film 4 is flattened by the chemical and mechanical polishing treatment (CMP) so that the thickness of the first interlayer insulating film 4 on the diffusion layer region 1 is finally equal to about 0.8 micrometer. Thereafter, a contact opening portion (not shown) is selectively formed, a barrier metal layer 5A, aluminum layer 6A of about 0.5 micrometer thickness and titanium nitride layer 7A of about 30 nm thickness are successively formed by the sputtering method, a desired pattern is left by the photolithography process and the reactive ion etching process to form the first layer wiring 8, and then SiOF film 9 is formed by the bias ECR method so as to have a thickness of about 0.6 micrometer on the relatively wide wiring. At this time, the gap portion of the first layer wiring 8 is perfectly filled with SiOF film 9, and SiOF film 9 on the relatively narrow wirings is formed in a triangular shape.

Figure 12:
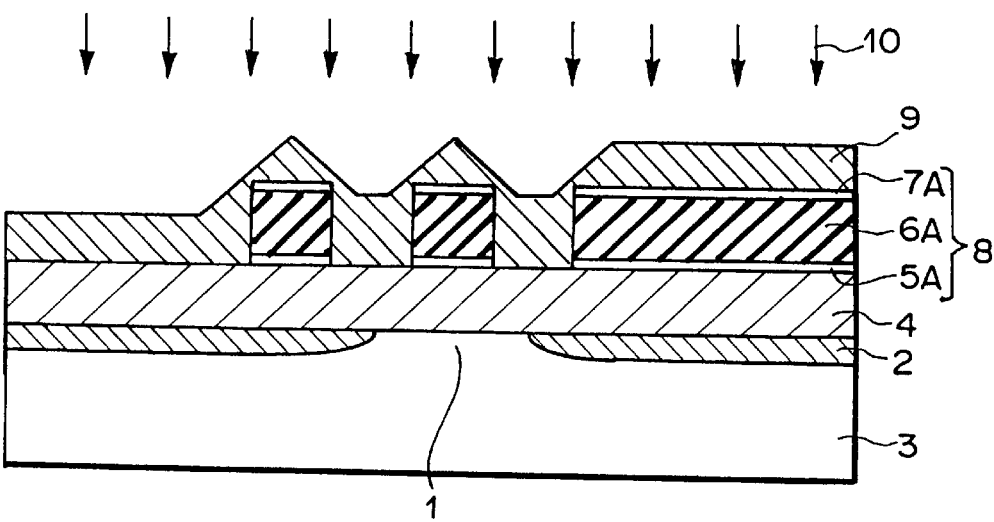
FIG. 12 is a cross-sectional view showing the manufacturing process of a second embodiment according to the present invention.

Subsequently, as shown in FIG. 12, fluorine ions 10 are implanted into the overall surface, for example under the following condition: an acceleration energy of 10 keV to 100 keV and a dose amount of $5 \times 10^{14}$ cm$^{-2}$ to $3 \times 10^{15}$ cm$^{-2}$, thereby increasing the fluorine concentration of SiOF film 9.

Subsequently, as shown in FIG. 13, the anisotropic etching is carried out by the reactive ion etching treatment to remove SiOF on the upper surface of the first layer wiring 8. At this time, the high fluorine concentration SiOF film 11 is formed having about a half thickness of the first layer wiring 8 at the center in the gap portion of the first layer wiring.

Subsequently, as shown in FIG. 14, the low fluorine concentration SiOF film 12 is formed by the bias ECR plasma CVD method or the like, and flattened by the chemical and mechanical polishing treatment. The fluorine concentration of SiOF film 12 is preferably set to be equal to or lower than the fluorine concentration of SiOF 11 before the ion implantation.

The thickness of the low fluorine concentration SiOF 12 is set to about 0.8 micrometer on the first layer wiring 8, the viahole 13 is selectively formed in the low fluorine concentration SiOF film 12 on the first layer wiring 8, a barrier metal layer 5B comprising titanium of about 30 nm thickness and titanium nitride of about 0.1 micrometer thickness which are deposited in this order from the lower side is formed by the sputtering method or the like, tungsten film is formed on the overall surface by the CVD method, and then the etch-back treatment is carried out to leave tungsten plug 14 only in the viahole 13. Thereafter, an aluminum layer 6B of about 0.5 micrometer thickness and a titanium nitride layer 7B of about 50 nm thickness are successively formed by the sputtering method or the like, and a desired pattern is formed by the photolithography process and the reactive ion etching process to form the second layer wiring 15.

Subsequently, the steps from FIG. 11 to FIG. 14 are repeated once again to form the third layer wiring 20, and finally the cover film 21 of SiON or the like is formed, thereby completing the final structure analogous to FIG. 5.

The manufacturing method as described above is applied to the three layer metallization structure, however, it may be applied to a more multilayer metallization structure by increasing the number of repetition of the steps from the step of forming the interlayer insulating film to the step of forming the upper layer wiring.

In the manufacturing method described above, fluorine ions are implanted after SiOF film 9 is formed and prior to the etching thereof unlike the first embodiment, so that the wirings are not directly exposed to fluorine ions, and thus the wirings can be prevented from being corroded.

In the above-described first and second embodiments, the present invention is applied to the semiconductor device having the multilayer metallization structure, however, it is needless to say that the present invention is applied to a semiconductor device having a single layer metallization structure.

What is claimed is:

1. A semiconductor device manufacturing method, comprising:

a step of forming a plurality of wirings on a plane;

a step of forming a first insulating film of SiOF on the plane having the wirings formed thereon, wherein a gap portion of the wirings is perfectly filled with SiOF film and the first insulating film forms a triangular surface on the wirings, and removing a first portion of the first insulating film on the upper surface of the wirings;

a step of introducing fluorine into a second portion of the first insulating film remaining at a wiring gap portion; and a step of forming a second insulating film of SiOF.

2. The semiconductor device manufacturing method as claimed in claim 1, wherein the fluorine concentration of SiOF of the second insulating film is set to be equal to or less than the fluorine concentration of SiOF of the first insulating film before fluorine is introduced.

3. The semiconductor device manufacturing method as claimed in claim 1, wherein fluorine is introduced by ion implantation under the condition of an acceleration energy of 10 keV to 100 keV and a dose amount of $5\times10^{14}$ cm$^{-2}$ to $3\times10^{15}$ cm$^{-2}$.

4. The semiconductor device manufacturing method as claimed in claim 1, wherein the second portion of the first insulating film remains having 1/3 to 1/1 of thickness of the wirings at the center of the gap portion of the wirings.

5. The semiconductor device manufacturing method as claimed in claim 1, wherein the second portion of the first insulating film remains having about a half of thickness of the wirings at the center of the gap portion of the wirings.

6. A semiconductor device manufacturing method, comprising:

a step of forming a plurality of wirings on a plane;

a step of forming a first insulating film of SiOF on the plane having the wirings formed thereon, wherein a gap portion of the wirings is perfectly filled with SiOF film and the first insulating film forms a triangular surface on the wirings, and introducing fluorine into the first insulating film;

a step of removing the first insulating film on the upper surface of the wirings; and a step of forming a second insulating film of SiOF.

7. The semiconductor device manufacturing method as claimed in claim 6, wherein the fluorine concentration of SiOF of the second insulating film is set to be equal to or less than the fluorine concentration of SiOF of the first insulating film before fluorine is introduced.

8. The semiconductor device manufacturing method as claimed in claim 6, wherein fluorine is introduced by ion implantation under the condition of an acceleration energy of 10 keV to 100 keV and a dose amount of $5\times10^{14}$ cm$^{-2}$ to $3\times10^{15}$ cm$^{-2}$.

9. The semiconductor device manufacturing method as claimed in claim 6, wherein the first insulating film remains having 1/3 to 1/1 of thickness of the wirings at the center of the gap portion of the wirings after the step of removing the first insulating film on the upper surface of the wirings.

10. The semiconductor device manufacturing method as claimed in claim 6, wherein the first insulating film remains having about a half of thickness of the wirings at the center of the gap portion of the wirings after the step of removing the first insulating film on the upper surface of the wirings.

* * * * *